United States Patent [19]
Takamine et al.

[11] Patent Number: 5,592,655
[45] Date of Patent: Jan. 7, 1997

[54] LOGIC SIMULATION METHOD

[75] Inventors: Yoshio Takamine; Kei Suzuki, both of Kokubunji; Toshihiko Sugita, Hachioji, all of Japan

[73] Assignee: Hitachi, Ltd., Tokyo, Japan

[21] Appl. No.: 341,115

[22] Filed: Nov. 18, 1994

Related U.S. Application Data

[63] Continuation of Ser. No. 742,411, Aug. 8, 1991, abandoned.

[30] Foreign Application Priority Data

Aug. 10, 1990 [JP] Japan ..................... 2-210342

[51] Int. Cl.$^6$ .................................. G06F 9/455
[52] U.S. Cl. ........................... 395/500; 364/578
[58] Field of Search .............. 364/DIG. 1 MS File, 364/DIG. 2 MS File, 578; 395/500

[56] References Cited

U.S. PATENT DOCUMENTS 5,062,067 10/1991 Schaefer et al. ................. 364/578

OTHER PUBLICATIONS

24th ACM/IEEE Design Automation Conference, "Demand Driven Simulation: BACKSIM", Smith et al, pp. 181–187.

Advances in CAD for VLSI, vol. 2, pp. 145–146, Jul. 1986.

*Primary Examiner*—Robert B. Harrell
*Attorney, Agent, or Firm*—Fay, Sharpe, Beall, Fagan, Minnich & McKee

[57] ABSTRACT

For simulation evaluation of combinational logic, changes in input signals are reserved for events occurring with respect to every element of the combinational logic circuit or of a partial circuit within the logic circuit according to demand timing. To inhibit wasteful processes, when the output value of a pertinent element or partial circuit is required by an element included in another partial circuit, i.e. when a demand has been sensed, only then are the events which occurred before evaluation.

14 Claims, 11 Drawing Sheets

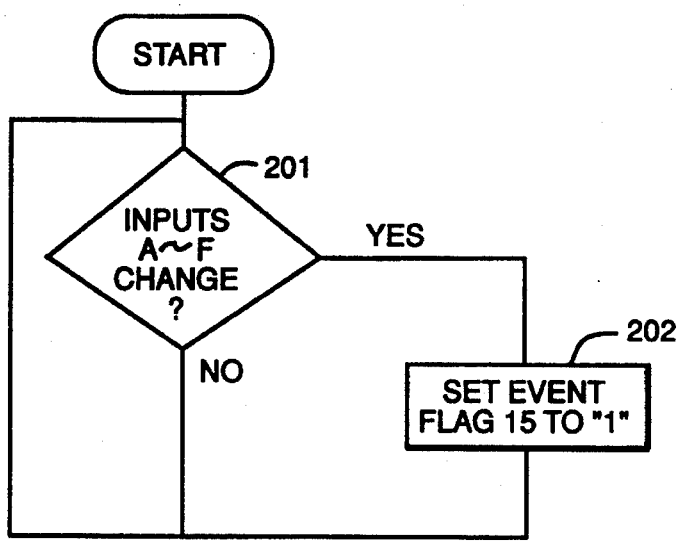
FIG. 2(a)
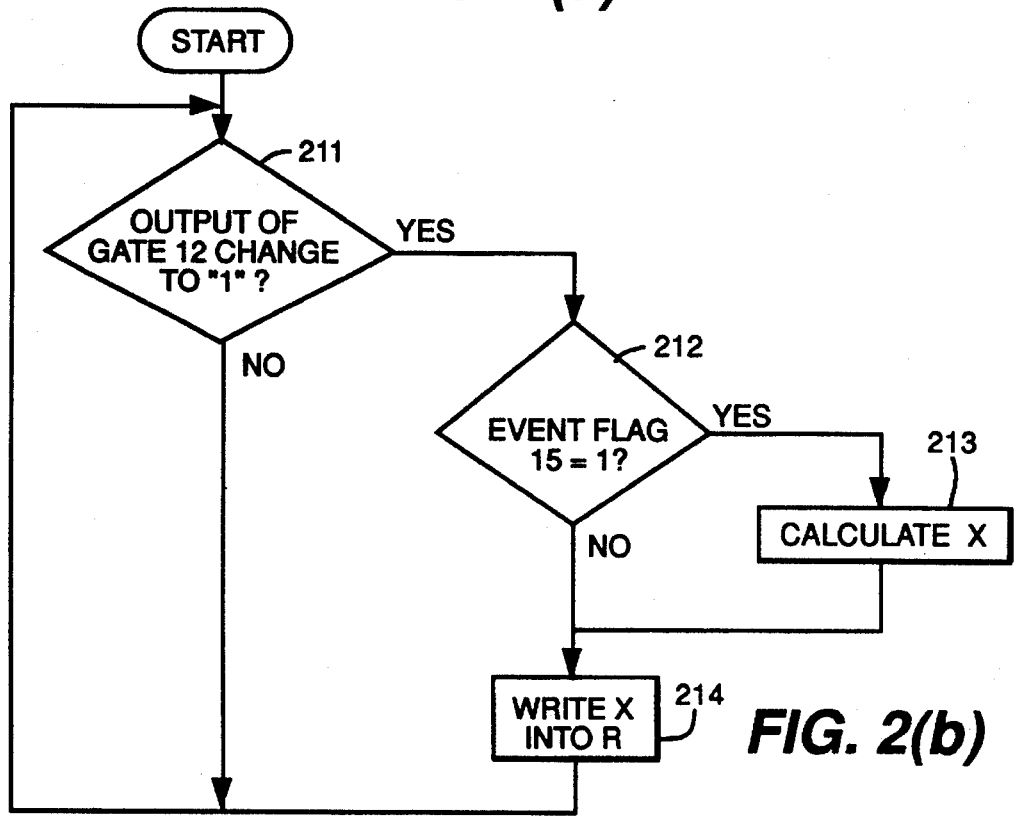
FIG. 2(b)
INPUT: KO, CTL, A, B, C, D, E, F;
REGISTER: R;
IF CTL AT KO
THEN R: = ( (A ¦ B) & C & (D = E) )¦F;
FIG. 3

FIG. 4(a)

|  | AA | BB | 41 |
|---|---|---|---|
|  | ⋮ | ⋮ |  |
| 411-1 #11 | (KO) | #41 | 411, 411-2 |
| 412-1 #12 | (CTL) | #41 | 412, 412-2 |
| 413-1 #13 | (A) | #42 | 413, 413-2 |
| 414-1 #14 | (B) | #42 | 414, 414-2 |
| 415-1 #15 | (C) | #42 | 415, 415-2 |
| 416-1 #16 | (D) | #42 | 416, 416-2 |
| 417-1 #17 | (E) | #42 | 417, 417-2 |
| 418-1 #18 | (F) | #42 | 418, 418-2 |
|  | ⋮ | ⋮ |  |

FIG. 4(b)

|  | CC | DD | 42 |
|---|---|---|---|
|  | ⋮ | ⋮ |  |
| #21 | (R) |  | 421, 421-2 |
| 421-1 |  |  |  |
|  | ⋮ | ⋮ |  |

FIG. 4(c)

|  | EE | FF | GG | 43 |
|---|---|---|---|---|
|  | ⋮ | ⋮ | ⋮ |  |
| #31 | #21 | #41 | #42 | 431 |
|  | ⋮ | ⋮ | ⋮ |  |
| 431-1 | 431-2 | 431-3 |  |  |

FIG. 7(a)

| | AA | BB | |
|---|---|---|---|
| | ⋮ | ⋮ | 71 |
| 711-1 #11 | (KO) | #51 | 711, 711-2 |
| 712-1 #12 | (CTL) | #51 | 712, 712-2 |
| 713-1 #13 | (A) | #52 | 713, 713-2 |
| 714-1 #14 | (B) | #52 | 714, 714-2 |
| 715-1 #15 | (C) | #54 | 715, 715-2 |
| 716-1 #16 | (D) | #53 | 716, 716-2 |
| 717-1 #17 | (E) | #53 | 717, 717-2 |
| 718-1 #18 | (F) | #55 | 718, 718-2 |
| | ⋮ | ⋮ | |

FIG. 7(b)

| | SS | TT | KK | LL | MM | |
|---|---|---|---|---|---|---|
| | ⋮ | ⋮ | ⋮ | ⋮ | ⋮ | 75 |
| 751-1 #51 | 751-2 | 1 | 751-4 | & | #12, #11 | 751, 751-5 |
| 752-1 #52 | 752-2 | 0 | 752-4 | ! | #13, #14 | 752, 752-5 |
| 753-1 #53 | 753-2 | 0 | 753-4 | = | #16, #17 | 753, 753-5 |
| 754-1 #54 | 754-2 | 0 | 754-4 | & | #52, #15, #53 | 754, 754-5 |
| 755-1 #55 | 755-2 | 1 | 755-4 | 754-3 | #54, #18 | 755, 755-5 |
| | ⋮ | ⋮ | ⋮ | ⋮ | ⋮ | |

753-3, 755-3

| | EE | FF | GG | ─73 |
|---|---|---|---|---|
| ⋮ | ⋮ | ⋮ | ⋮ | |
| #31 | #21 | #51 | #53 | ─731<br>─731-3 |
| | ⋮ | ⋮ | ⋮ | |

| | SS | TT | KK | LL | MM | VV | ─95 |
|---|---|---|---|---|---|---|---|
| | ⋮ | ⋮ | ⋮ | ⋮ | ⋮ | | |
| #51 | 951-2 | 1 | 951-4 | & | #12, #11 | | ─951<br>─951-6 |
| #52 | 952-2 | 0 | 952-4 | ! | #13, #14 | #54 | ─952<br>─952-6 |
| #53 | 953-2 | 0 | 953-4 | = | #16, #17 | #54 | ─953<br>─953-6 |
| #54 | 954-2 | 0 | 954-4 | & | #52, #15, #53 | #55 | ─954<br>─954-6 |
| #55 | 955-2 | 1 | 955-4 | 954-3 | #54, #18 | | ─955<br>─955-6 |
| | ⋮ | ⋮ | ⋮ | ⋮ | ⋮ | ⋮ | |

FIG. 9

LOGIC SIMULATION METHOD

This is a continuation application of U.S. Ser. No. 07/742,411, filed Aug. 8, 1991, now abandoned.

BACKGROUND OF THE INVENTION

The present invention relates to logic simulation, and more particularly to a logic simulation which is well suited to simulate the behavior of a logic device in terms of register-transfer levels.

Heretofore, the selective trace technique and the selective event technique have been known for executing logic simulations at high speed, as discussed in "Advances in CAD for VLSI", Vol. 2, pp. 145–146, July, 1986. With the selective trace technique, an output value calculating process is performed for only elements whose signal values at their input pins changed, that is, as to which events occurred. Thus, it is possible to reduce the number of events to-be-processed and to sharply shorten a simulation time period. On the other hand, the selective event technique exploits the property that, in an AND gate by way of example, insofar as the signal value of at least one of the input pins thereof is "0", the output signal value thereof remains unchanged at "0" even when the signal value of any of the other input pins changes. It adopts a method wherein, even in case of the change of the signal value of any input pin, that is, the occurrence of an event, the output signal value of the element is not calculated by reason of the signal value of another input pin. Thus, it can reduce the number of events to-be-processed still more than the selective trace technique.

The demand driven simulation algorithm is stated in "24th Design Automation Conference Proceedings", pp. 181–187, June, 1987. With the demand driven simulation algorithm, unnecessary evaluations are inhibited to shorten a simulation time period by a method wherein a process is begun with any desired signal at any desired time at which a simulation result is to be obtained, and wherein signal values required for obtaining the result are successively found while the connectional relationship of a logic and the time are being backtraced or backtracked.

SUMMARY OF THE INVENTION

In the selective trace technique, the calculation of the output values of the elements constituting a circuit to-be-simulated is caused by only the events, namely, the changes of the input values of the pertinent elements, and whether or not an element included in another partial circuit refers to an output value calculated anew is not taken into consideration at all. Accordingly, when a new event arises after the calculation of the output value at a certain point of time and before the reference to this output value by the element included in the other partial circuit, the output value calculation is performed again, resulting in the problem that the last calculation of the output value becomes useless. By way of example, let's consider the simulation of a logic circuit shown in FIG. 11. In the selective trace technique, the evaluation of a combinational circuit 11 is caused by the change of any of the input signals A, B, C, D, E and F (DATA) as illustrated, with respect to DATA changes at times $t_1$, $t_3$, $t_5$ in FIG. 12. Nevertheless, the content of a register R at a posterior stage is updated with the output x of the combinational logic 11 only at $t_4$ when a control signal CTL is true and clock signal KO has risen. Accordingly, when the control signal CTL is false, the calculation of the output value X of the combinational circuit 11 in FIG. 11 becomes useless. Thus processing of the change in events to produce an output (x) at $t_1$ and $t_5$ is unnecessary. On the other hand, in the selective event technique, when the signal value of any input pin of a certain element changed, that is, when an event arose, also the type of the element and the signal values of the other input pins thereof must be read out. Accordingly, the selective event technique requires more processing overhead as compared with the selective trace technique. Further, the demand driven simulation algorithm requires an overhead ascribable to recurrent processes, such as evaluating an identical signal at the same time again and again.

An object of the present invention is to solve the problems stated above, and to provide a logic simulation of high speed which can inhibit wasteful processes for calculating output values of combination logic simulated, particularly with respect to VSLI.

The object of the present invention is accomplished by reserving changes in input signals, namely events, for every element which constitutes a circuit to-be-simulated or every partial circuit in each of which a plurality of elements are put together, and sensing a timing, namely a demand, at which an output value of the element or the partial circuit is referred to by any element included in another partial circuit.

An event having occurred in a certain element or partial circuit is not immediately evaluated, but is reserved for every element or partial circuit. In a case where the output value of the pertinent element or partial circuit is required by any element included in another partial circuit, that is, at the point of time at which a demand has been sensed, the events which occurred before are evaluated. In this way, wasteful processes for calculating output values are inhibited.

BRIEF DESCRIPTION OF THE DRAWINGS

Further objects, features and advantages of the present invention will become more clear upon the following detailed description of preferred embodiments as shown in the drawing, wherein:

FIG. 1 and FIGS. 2(a)–2(b) are diagrams showing the essential features of the present invention;

FIG. 3 is a diagram showing a descriptive method for a simulation model;

FIGS. 4(a), 4(b), 4(c), 4(d), 4(e), and 4(f) are diagrams showing the data structures;

FIGS. 7(a), 7(b), and 7(c) are diagrams showing the data structures of the second embodiment;

FIG. 9 is a diagram showing the data structure of the third embodiment;

DETAILED DESCRIPTION OF THE PREFERRED EMBODIMENT

While three embodiments of the present invention will be described below, the essential features of the embodiments and a simulation model to serve as inputs will be explained in advance.

In the first place, the essential features of the embodiments will be described with reference to FIG. 1 and FIGS. 2(a)–2(b).

Figure 1:
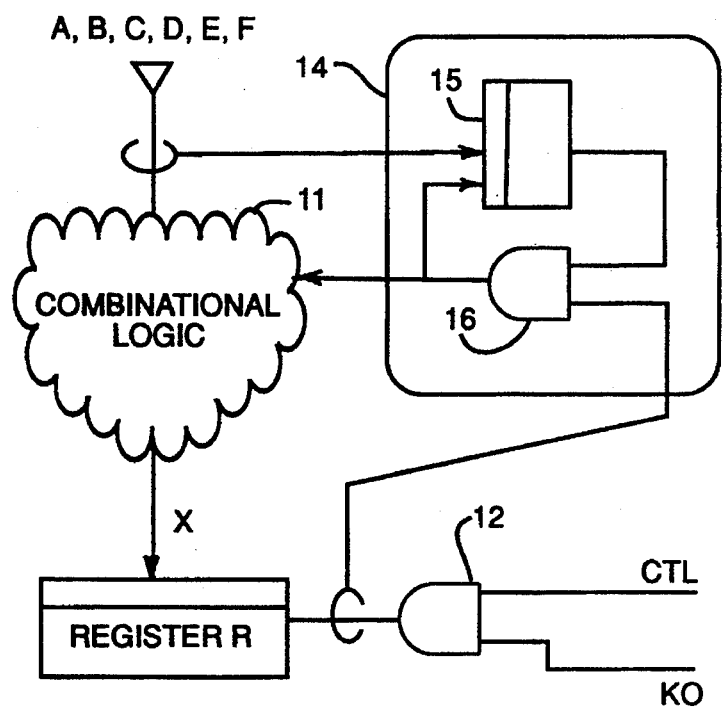

FIG. 1 is a diagram showing the outline of the construction of each of the embodiments. In each embodiment, a portion 14 enclosed with a border in a thick line is added as pseudo logic. The additional pseudo logic 14 includes an event flag 15 and an AND gate 16. Although, in FIG. 1, one event flag 15 and one AND gate 16 exist in correspondence with a combinational logic 11 having output X, it is also possible to arrange event flags and AND gates in correspondence with many operators which constitute a combinational logic. The AND gate 16 has one input from the register containing the event flag 15 and another input sensing a demand, i.e., a change in the value of the output of AND gate 12. The AND gate 12 has two inputs, namely a control signal CTL and a clock signal KO. The output, a demand, of the AND gate 12 is provided to enable the register R, which also receives the output X of the combinational logic 11. The output of AND gate 16, in addition to being provided to enable the combinational logic 11 for calculation, is provided to reset the event flag 15. The event flag 15 is set by a change in any one of the input signals A, B, C, D, E, F (DATA) which are provided to the combinational logic 11.

Next, the outline of the operation of each embodiment will be described with reference to FIGS. 2(a)–2(b). The operation of each embodiment includes two processes independent of each other; an event reserving process of FIG. 2(a) and a demand sensing process of FIG. 2(b).

In the event reserving process shown in FIG. 2(a), input signals A, B, C, D, E and F are first monitored by a step 201, as explained with respect to FIG. 1. When the value of at least one of the signals A–F changed, the process proceeds to step 202, and when is has not, the step 201 is performed again. At the step 202, '1' is set in the event flag 15 to reserve the fact that an event (input change) has occurred, whereupon the process proceeds to the step 201 immediately.

In the demand sensing process shown in FIG. 2(b), a set signal for register R of FIG. 1, that is, the output signal of gate 12 (demand) is first monitored by step 211. When the value of the output signal of gate 12 changed to '1', as the enable signal of register R, and the process proceeds to a step 212, and when not, the step 211 is performed again. At the step 212, the status of the event flag 15 is checked. When the status of event flag 15 is '1', the value of at least one of the input signals A, B, C, D, E and F (DATA) of the combinational logic 11 has already changed (an event occurred), and hence, the process proceeds to a step 213. Otherwise, the input signal values have remained unchanged (no event occurred), and hence, the step 212 is followed by step 214. Therefore, at step 213, an event and a demand have occurred so that the output of gate 16 is at "1" to control the interior of the combinational logic 11, thereby the simulation calculates a new output value X, and the event flag 15 is reset with '0'. Thereafter, the step 213 is followed by the step 214. At the step 214, the output value X of the combinational logic 11 is written into the register R, whereupon the process proceeds to the step 211 again.

The basic features of the embodiments are as thus far described.

As indicated in FIG. 3, the simulation model is based on transferring behavior to the register, a condition to execute the behavior and a value to be transferred to the register, described in terms of signal names and a logic expression.

In FIG. 3, the first line beginning with "input" is the statement of the input signals, and the second line beginning with "register" is the statement of the register. The third line beginning with "if" designates the condition under which the behavior stated in the next or fourth line beginning with "then" is executed. More specifically, the behavior defined by "then" et seq. is executed in a case where the value of a control signal CTL is true at the timing of a clock signal KO. When the clock signal KO is input similarly to an ordinary signal, it has the same significance to describe "if" et seq. as "CTL & KO". The behavior defined by "then" et seq. indicates writing data into the register R, namely, transferring data to the register R. The right-hand side of symbol ":=" describes the value to be written into the register R, by the use of the logic expression. The example logic expression of combinational logic 11 as indicated in FIG. 3 signifies: to take the logical OR between the signals A and B; to subsequently take the logical AND among the above logical OR, the coincidence between the signals D and E, and the signal C; and to finally take the logical OR between the above logical AND and the signal F.

The first embodiment evaluates the logic expression of the combinational logic when there is a demand for the data transferring to the register and in which one event flag is provided for one logic expression, and will be described in detail with reference to FIGS. 4(a)–4(f), FIG. 5 and FIG. 6.

Figures 4D, 4E, 4F:
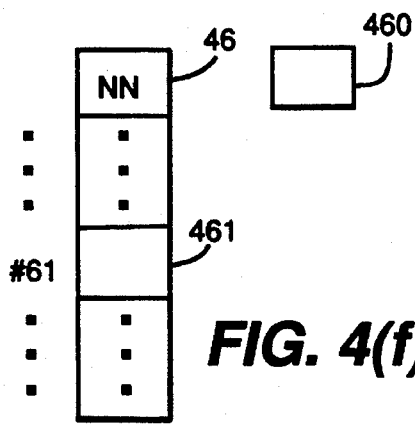

Referring first to FIGS. 4(a)–4(f), data structures for use in this embodiment will be described with respect to an input signal table (FIG. 4(a)), a register table in FIG. 4(b), a transferring behavior table in FIG. 4(c), an expression table in FIG. 4(d), an operator table in FIG. 4(e), and an execution list with respect to a counter for the number of registered transferring behaviors in FIG. 4(f). In these figures, the columns AA–NN provide the following values: AA is a signal pointer, BB is a fan out value, CC is a signal value, DD is a fan out pointer, EE is a transferring destination, FF is an execution condition, GG is a transferring source, HH is an event flag, II is a start pointer, JJ is an end pointer, KK is a signal value, LL is an operator, MM is a fan-in pointer, and NN is a transferring behavior pointer. At the left of each table, numerals succeeding sharps (#) indicate record Nos. for identifying individual records contained in the table. The record Nos. are uniquely determined throughout all the tables as keys in order to discriminate the tables to which the corresponding records belong.

Of the tables shown in FIGS. 4(a)–4(f), those in FIGS. 4(a) and 4(b) denote the schemes of circuits to be simulated and signal values, and those in FIGS. 4(c), 4(d) and 4(e) record behaviors during the simulation. The table of 4(f) is for a work area.

The input signal table 41 of FIG. 4(a) has the information items of respective input signals. The register table 42 of FIG. 4(b) has the information items of respective registers. The transferring behavior table 43 of FIG. 4(c) has the information items of each transferring to the register R. The expression table 44 of FIG. 4(d) has the information items of each logic expression denoting the contents of a corresponding combinational logic part. The operator table 45 of FIG. 4(e) has the information items of each operator constituting the logic expression. As regards a certain logic expression, one record of the expression table 44 of FIG. 4(d) is generated, and at least one record which corresponds to the operator constituting the pertinent logic expression is developed in the operator table 45. The execution list 46 of FIG. 4(f) is a working area in which executable transferring behaviors are temporarily held. The registration number counter 460 indicates the number of transferring behaviors registered in the execution list 46.

Next, the contents of the respective tables will be described.

Each of the individual records of the input signal table 41 shown in FIG. 4(a) has two fields. The first column of fields AA contains the signal value of the corresponding input signal. The second and third columns of fields BB indicates the logic expression which refers to the pertinent input signal value, and it contains the record No. within the expression table 44 shown in FIG. 4(d).

Each of the individual records of the register table 42 shown in FIG. 4(b) has two fields. The first column of fields CC contains the stored value of the corresponding register. The second column of fields DD indicates the logic expression which refers to the pertinent stored value of the register, and it contains the record No. within the expression table 44.

Each of the individual records of the transferring behavior table 43 shown in FIG. 4(c) consists of three fields. The first column of fields EE denotes the transferring destination register of the pertinent transferring, and it contains the record No. within the register table 42. The second and third columns of fields FF and third fields GG indicate the execution condition of the pertinent transferring and the transferring source thereof, respectively, and they contain the record Nos. of the input signal value table 41, register table 42 or expression table 44.

Each of the individual records of the expression table 44 shown in FIG. 4(d) consists of three fields. The first column of fields HH indicates the occurrence of an event in the input signal of the pertinent logic expression. More specifically, the first field has '0' when the event does not occur yet, and it has a value other than '0' when the event occurred. The second column of field II and third column of fields JJ contain the record Nos. which indicate the first one and last one of a series of records developed in the operator table 45 in correspondence with the pertinent logic expression, respectively.

Each of the individual records of the operator table 45 shown in FIG. 4(e) consists of three fields. The first column of fields KK contains the output value of the pertinent operator under the simulation execution. The second column of fields LL contains the type of the pertinent operator. The third column of fields MM contains those record Nos. of the input signal table 41, register table 42 or operator table 45 which indicate the storing locations of the input signal values of the pertinent operator.

In the operator table 45, a plurality of records corresponding to one logic expression are arrayed in conformity with the priority levels of operations in the case of evaluating the values of the pertinent logic expression. That is, any record among the plurality of records corresponding to one logic expression does not have an operating priority level lower than that of any underlying record. Owing to such sequencing of the records, when the values of the pertinent logic expression are to be evaluated, the records are processed successively from the smallest record No., whereby the final output value is naturally obtained.

The column NN of FIG. 4(f) contains signal values In FIGS. 4(a)–4(f), the contents of all the tables conform to the example of the description of the simulation model shown in FIG. 3. The descriptive example states the eight input signals KO, CTL, A, B, C, D, E, F and one register R. The records 411 through 418 of the input signal table 41 in FIG. 4(a) correspond respectively to the input signals KO, CTL, A, B, C, D, E, and F while the record 421 of the register table 42 in FIG. 4(b) corresponds to the register R. Transferring behavior for the register R is stated in the descriptive example shown in FIG. 3, and the record 431 of the transferring behavior table 43 in FIG. 4(c) corresponds thereto. Also, the two logic expressions are stated in the descriptive example shown in FIG. 3. One of them is the statement of line 3, "CTL at KO" succeeding "if", and this statement is interpreted as "CTL & KO". The other is the right-hand side of ":=" in the statement of the transferring behavior for the register R. The records 441 and 442 of the expression table 44 in FIG. 4(d) correspond to the above logic expressions, respectively. The two logic expressions include one operator and four operators, and the record 451 and the records 452 through 455 of the operator table 45 in FIG. 4(e) correspond thereto, respectively. The second fields 441-2 and 442-2 of the records 441 and 442 of the expression table 44, and the third fields 441-3 and 442-3 thereof indicate the corresponding start records within the operator table 45, namely, the record 451 of record No. 51 and the record 452 of record No. 52, and the corresponding end records, namely, the record 451 of record No. 51 and the record 455 of record No. 55, respectively. In the operator table 45, the record 454 of record No. 54, for example, indicates an AND operation whose fan-in number is 3, and corresponding fan-in locations are indicated by the content of the third field 454-3 of the record 454. That is, these locations are the record 452 of the operator table 45 at record No. 52, the record 415 of the input signal table 41 at record No. 15, and the record 453 of the operator table 45 at record No. 53. Among them, the record 415 of the input signal table 41 corresponds to the input signal C in the example shown in FIG. 3, and the other fan-in items refer to the outputs of the other operators within the same logic expression. It is to be noted that the tables of FIGS. 4(b) to 4(f) are indexed on the record numbers of the table of FIG. 4(a) to provide a relational data base.

The data structures of this embodiment are as thus far described.

Next, the process of this embodiment will be described with reference to FIG. 5.

At step 501, a table for executing a simulation is generated, and the values of various signals are initialized. Step 502 checks if a simulation end condition designated by the number of execution cycles, etc. was met. When the condition was met, the process is ended, and when not, the process proceeds to step 503. At the step 503, the signal value of clock signal KO is updated to advance the time of the simulation. At step 504, the values of external input signals applied to a logic to-be-simulated are updated with the progress of the simulation time as determined by the clock KO.

Figure 5:
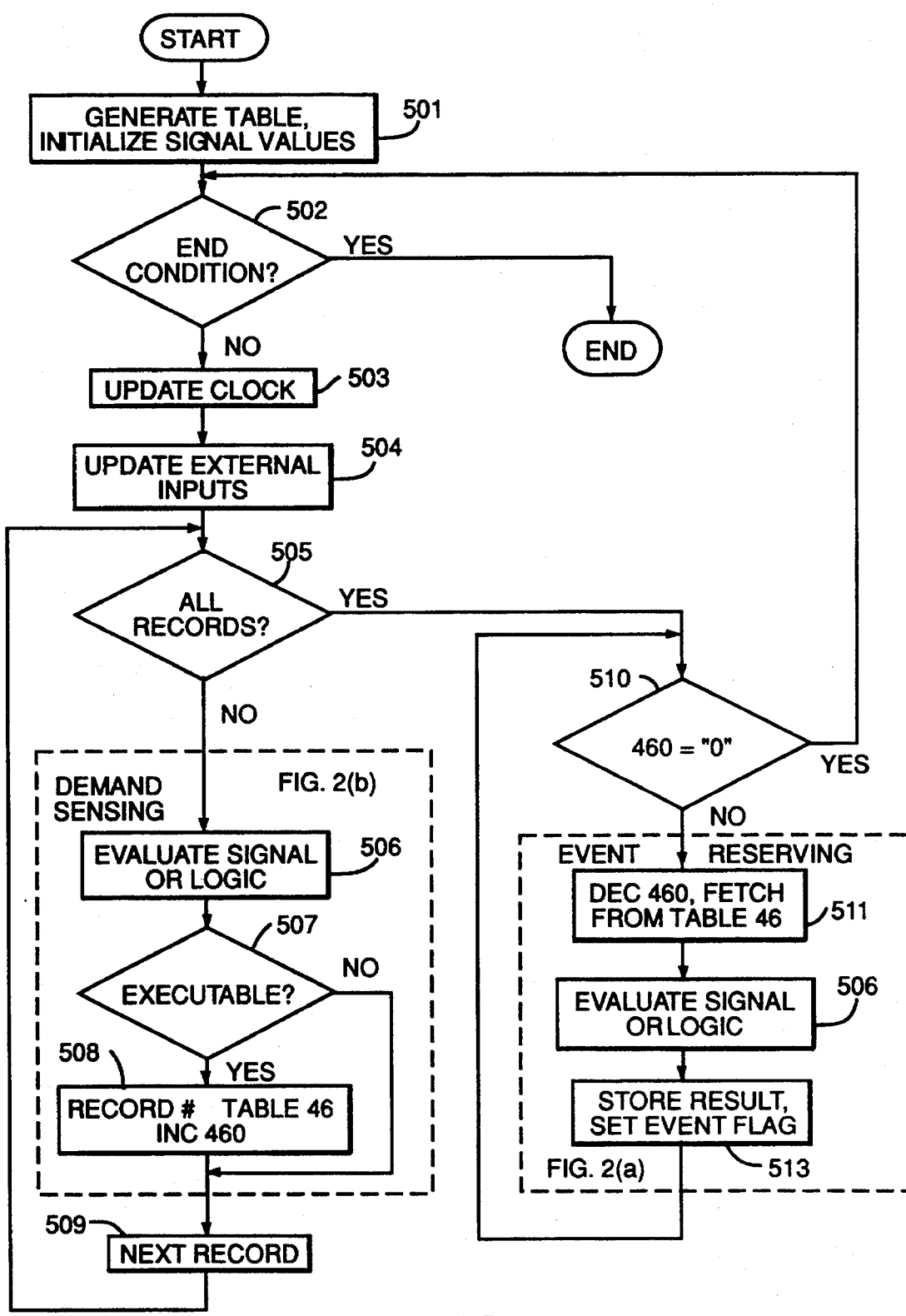
FIG. 5 is a flowchart showing the processing.
Figure 6:
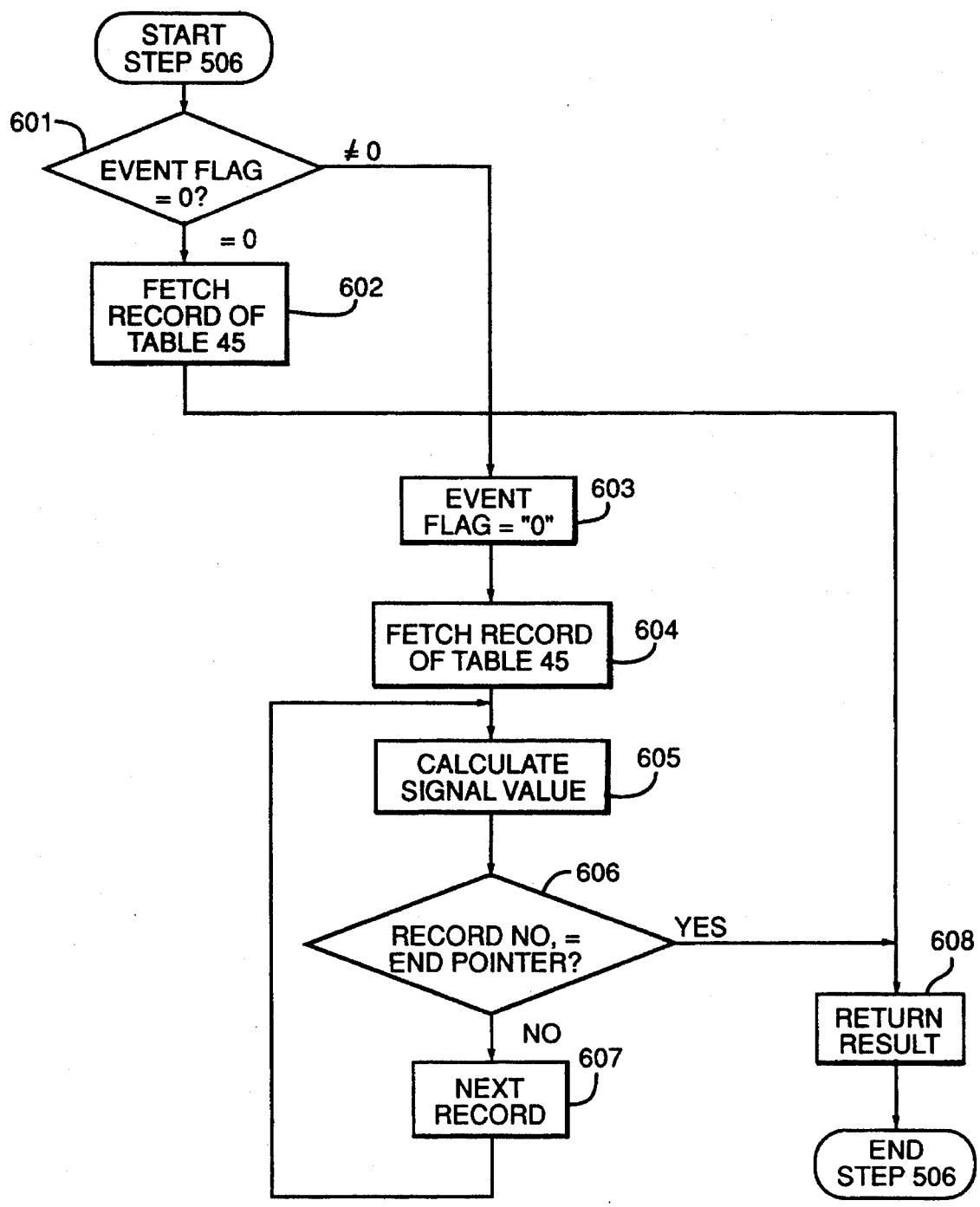
FIG. 6 is a flowchart showing the logic expression evaluating step.

Each time the clock signal KO is updated, steps 504 through 513 shown in FIG. 5 are executed for the whole circuit to-be-simulated. It is assumed that the input signals to the combinational logic 11 shown in FIG. 1 were updated at a certain clock pulse $t_1$, and that the signal to be written into the register R is not set yet at the time $t_1$. In such a state, the simulation of the combinational logic 11 is not performed, and the output value X is not delivered, either. When the write signal into the register R is set at the next clock pulse $t_2$, the simulation of the combinational logic 11 is performed, and the output value X is written into the register R.

Here, the set of the write signal into the register R is done when another combinational logic which includes a gate for producing the write signal has been simulated.

Thenceforth, the steps 505 through 509 are performed for all the records of the transferring behavior table 43 in FIG.

4(c). In particular, the steps 506, 507 and 508 correspond to the demand sensing process shown in FIG. 2(b), and a result obtained therein is registered in the transferring behavior table 43. The step 505 decides if the processes of all the records of the transferring behavior table 43 were completed. When the processes were completed, the step 505 is followed by the step 510, and when not, it is followed by the step 506. The step 506 evaluates the signal or logic expression which is indicated by the content of the second field (for example, 431-2) of the record (for example, record 431) of the transferring behavior table 43 being processed. A method of evaluating a signal or a logic expression will be described later. At the step 507, when the value of the evaluated result of the step 506 is '0', it is decided that the pertinent behavior is not executable at the present time, whereupon the process proceeds to the step 509. When the value is not '0', it is decided that the pertinent behavior is executable, whereupon the process proceeds to the step 508. At the step 508, the record No. of the record being processed, for example, the record 431 is additionally written into the execution table 46 in FIG. 4(f), and the content of the registration number counter 460 is incremented by one. At the step 509, the process is advanced to the next record within the transferring behavior table 43.

When it is decided at the step 505 that the processes concerning the transferring behavior table 43 were completed, this step is followed by the step 510. Thenceforth, the processing of the steps 510 through 513 is repeatedly executed until the content of the execution list 46 in which the record Nos. were registered at the steps 508 becomes empty. In particular, the steps 511, 506 and 513 correspond to the event reserving process shown in FIG. 2(a). When the transferring of data has been done, the result thereof is reserved as the occurrence of an event.

The step 510 decides whether or not the execution list of table 46 is empty, that is, whether or not the content of the registration number counter 460 is zero. When the content is zero, the process proceeds to the step 502, and when not, the process proceeds to the step 511.

At the step 511, the content of the registration number counter 460 is decremented by one, and the content of the execution list of table 46, that is, one record No. indicating the record of the transferring behavior table 43 is fetched from this list of table 46. The step 506 refers to the third field (for example, 431-3) of that record (for example, record 431) within the transferring behavior table 43 which is indicated by the record No. fetched at the step 511, and it evaluates the signal or logic expression indicated by the content of the third field. The step 513 refers to the first field (for example, 431-1) of that record (for example, record 431) within the transferring behavior table 43 which is indicated by the record No. fetched at the step 511, and it writes the value of the evaluated result of the step 506 into the first field (for example, 421-1) of that record (for example, record 421) within the register table 42 which is indicated by the content of the first field referred to. Further, this step 513 refers to the second field 421-2 and sets '1' as the content of the first field, namely, event flag 15 of the record within the expression table 44 as indicated by the content of the second field referred to, for example, the content of the field 441-1. After the execution of the step 513, the process proceeds to the step 510 again.

At the step 506, the evaluation of the signal or logic expression is carried out as follows:

In a case where the content of the second field (for example, 431-2) or third field (for example, 431-3) of the record (for example, record 431) of the transferring behavior table 43 being processed indicates the input signal table 41 or the register table 42, the signal is evaluated. On the other hand, in a case where the above content does not indicate the table 41 or 42, but it indicates the expression table 44, the logic expression is evaluated. The "evaluation of the signal" signifies that the content of the first field of the indicated record within the input signal table 41 or register table 42 is read out as a signal value. The method of evaluating the logic expression for step 506 will now be described in detail with reference to FIG. 6.

A step 601 refers to the first field, namely, event flag (for example, 442-1) of the record (for example, record 442) within the expression table 44 being processed. When the status of the event flag is '0', the step 601 is followed by a step 602 because no input signal value of the corresponding logic expression changed, and when not, the step 601 is followed by a step 603. The step 602 refers to the end pointer of the third field 442-3 of expression table 44 and fetches the record within the operator table 45 indicated by the end pointer content "#55", of the third field referred to, that is, the record 455, of table 45, as an object to be processed by a succeeding step 608, whereupon processing proceeds to the step 608.

The step 603 resets "0" as the content of the event flag contained in the record within the expression table 44 being processed, for example, the first field 442-1 of the record 442. A step 604 refers to the second field 442-2 having the start pointer of expression table 44 and fetches the record, for example, record 452 within the operator table 45 indicated by the start pointer content of the second field referred to, which record is an object to be processed by a succeeding step 605.

Steps 605 through 607 are steps for the actual evaluation. The step 605 refers to the third field (for example, 452-3) of the fan-in record (for example, 452) within the operator table 45 being processed, and it fetches a signal value from that record within the input signal table 41, register table 42 or operator table 45 which is indicated by the content of the third field referred to. Further, the step 605 refers to the second field 452-2 and executes a calculation conforming to the operator content of this second field, for the signal values fetched before. The calculated result is stored in the first field 452-1 of the same record. The step 606 checks if the record No. of the record within the operator table 45 being processed coincides with the content (namely, end pointer) of the third field (for example, 442-3) of the record(for example, 442) within the expression table 44 being processed. When the record No. coincides with the end pointer, the step 606 is followed by the step 608 because the processing of a series of operators corresponding to the logic expression has ended, and when not, the step 606 is followed by the step 607. At this step 607, the process is advanced to the next record within the operator table 45.

At the step 608, the content of the first field (for example, 455-1) of the record (for example, 455) within the operator table 45 being processed is fetched and is returned as the evaluated result of the logic expression.

The method of evaluating the logic expression for the first embodiment is as thus far described.

According to this first embodiment, the logic expression corresponding to the combinational logic part is evaluated only when the result X transferring to the register R refers to the demanded value of the logic expression as executed, so that useless event evaluations can be suppressed.

Now, the second embodiment of the present invention will be described with reference to FIGS. 7(a)–7(c) of FIG. 8.

The second embodiment is such that flags are respectively provided for a plurality of operators included in one logic expression, and that each time the input value of any of the operators changes, the logic expression is evaluated.

To begin with, data structures for use in this embodiment will be described with reference to FIGS. 7(a)–7(c).

An input signal table 71 shown in FIG. 7(a) has the information items of respective input signals, and it has the same organization as that of the input signal table 41 shown in FIG. 4(a) in the first embodiment. A transferring behavior table 73 shown in FIG. 7(c) has the information of each transferring to a register, and it has the same organization as that of the transferring behavior table 43 shown in FIG. 4(c) in the first embodiment. An operator table 75 shown in FIG. 7(b) contains the information of each of operators which constitute a logic expression of a combinational logic part. The table of FIG. 7(b) has an organization in which the operator table 45 shown in FIG. 4(e) is extended. The following processing does not use the expression table 44 shown in FIG. 4(d). The second field of each record of the input signal table 71 indicates the operator which refers to the value of the pertinent input signal of the first field, and it contains the record No. mentioned in the operator table 75. Besides, the second field and third field of each record of the transferring behavior table 73 contain record Nos. mentioned in the input signal table 71, the register table 42 shown in FIG. 4(b), or the operator table 75.

Each of the records of the operator table 75 consists of five fields. The first field indicates the occurrence of an event in any input signal of the pertinent operator. Columns SS and TT of FIG. 7(b) refer to the event flag and end flag, respectively. More specifically, the first field is an event flag has '0' when the event does not occur yet, and it has a value other than '0' when the event occurred. The second field is an end flag which when set indicates that the pertinent record is the last one of a series of records developed in correspondence with the logic expression which includes the operator corresponding to the pertinent record. More specifically, the second field has '0' when the pertinent record is not the last one, and it has a value other than '0' when the pertinent record is the last one. The third field through the fifth field of the operator table 75 are respectively the same as the first field through the third field of the operator table 45 shown in FIG. 4(e) in the first embodiment. More specifically, the third field contains the output value of the pertinent operator under the simulation execution. The fourth field contains the type of the pertinent operator. The fifth field contains those record Nos. of the input signal table 71, register table 42 shown in FIG. 4(b), or operator table 74 which indicate the storing locations of the input signal values of the pertinent operator. In the operator table 75, a plurality of records corresponding to one logic expression are sequenced in conformity with the priority levels of operations, in the same manner as in the first embodiment.

While, in this embodiment, the register table and an execution list are employed in addition to the input signal table 71, the transferring behavior table 73 and operator table 75, explained above, have the organizations that are the same as those respectively shown in FIG. 4(b) and FIG. 4(f) in the first embodiment.

The data structures of this second embodiment are as thus far described.

The outline of the process is the same as shown in FIG. 5 in the first embodiment. Since, in the second embodiment, the step of evaluating the logic expression differs from that of the first embodiment shown in FIG. 6, it will now be described with reference to FIG. 8.

In a case where the content of the second field (for example, 731-2) or third field (for example, 731-3) of the record (for example, 731) being processed within the transferring behavior table 73 in FIG. 7(c) points to the operator table 74 in FIG. 7(b), the logic expression evaluation is begun with an indicated record, for example, a record 752.

Figure 8:
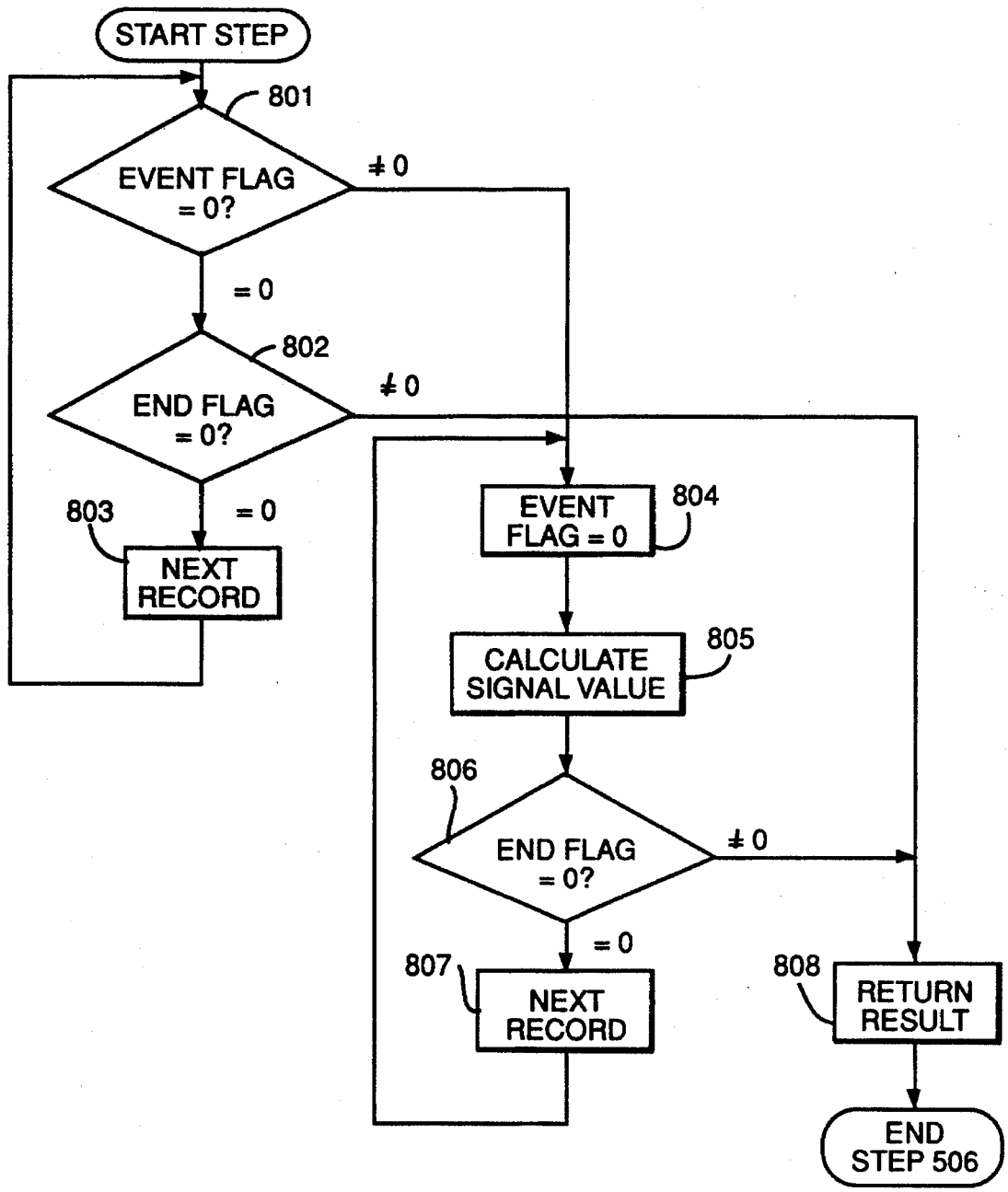
FIG. 8 is a flowchart showing the logic expression evaluating step of the second embodiment.

At steps 801 through 803 in FIG. 8, records are skipped over until the appearance of a record within the operator table 75 that contains a non-zero content in its first field. The step 801 refers to the first field (for example, 752-1) of the record within the operator table 75 being processed, for example, the record 752. When the event flag content of the first field 752-1 is '0', the step 801 is followed by the step 802 because no input signal value of the corresponding operator changed, and when not '0' the step 801 is followed by a step 804. The step 802 refers to the end flag of second field 752-2. When the content of the second field is '0', the step 802 is followed by the step 803 and when not, the step 802 is followed by a step 808 because the pertinent record is the final record constituting the corresponding logic expression. At the step 803, the process is advanced to the next record within the operator table 75.

The step 804, et seq. function for the actual evaluation. The step 804 sets '0' as the content of the event flag contained in the first field (for example, 752-1) of the record being processed, for example, the record 752. Step 805 refers to the fifth field 752-5 and fetches a signal value from the record within the input signal table 71, register table or operator table 75 indicated by the content of the referred to fifth field. Further the step 805 refers to the fourth field 752-4 and executes a calculation conforming to the content of this fourth field, for the signal value fetched before. The calculated result is stored in the third field 752-3 of the same record. Likewise to the step 802, a step 806 refers to the second field (for example, 752-2) of the record being processed, for example, the record 752. When the content of the second field 752-2 is '0', the step 806 is followed by step 807, and when not, the step 806 is followed by the step 808. The step 802 refers to the second field 752-2. At the step 807, the process is advanced to the next record within the operator table 75. At the step 808, the content of the third field (for example, 755-3) of the record (for example, 755) being processed is fetched and is returned as the evaluated result of the logic expression.

The processing of evaluating the logic expression in the second embodiment is as stated above.

According to this second embodiment, as in the first embodiment, the logic expression corresponding to the combinational logic part is evaluated only when the result X transferring to the register R refers to the demanded value of the logic expression executed, so that useless event evaluations can be suppressed. Moreover, the evaluation of the logic expression is not done for every operator constituting the logic expression and as to only the operator whose input value changed or whose preceding operator was evaluated, so that the number of evaluations of the operators can be curtailed still more than in the first embodiment.

Figure 10:
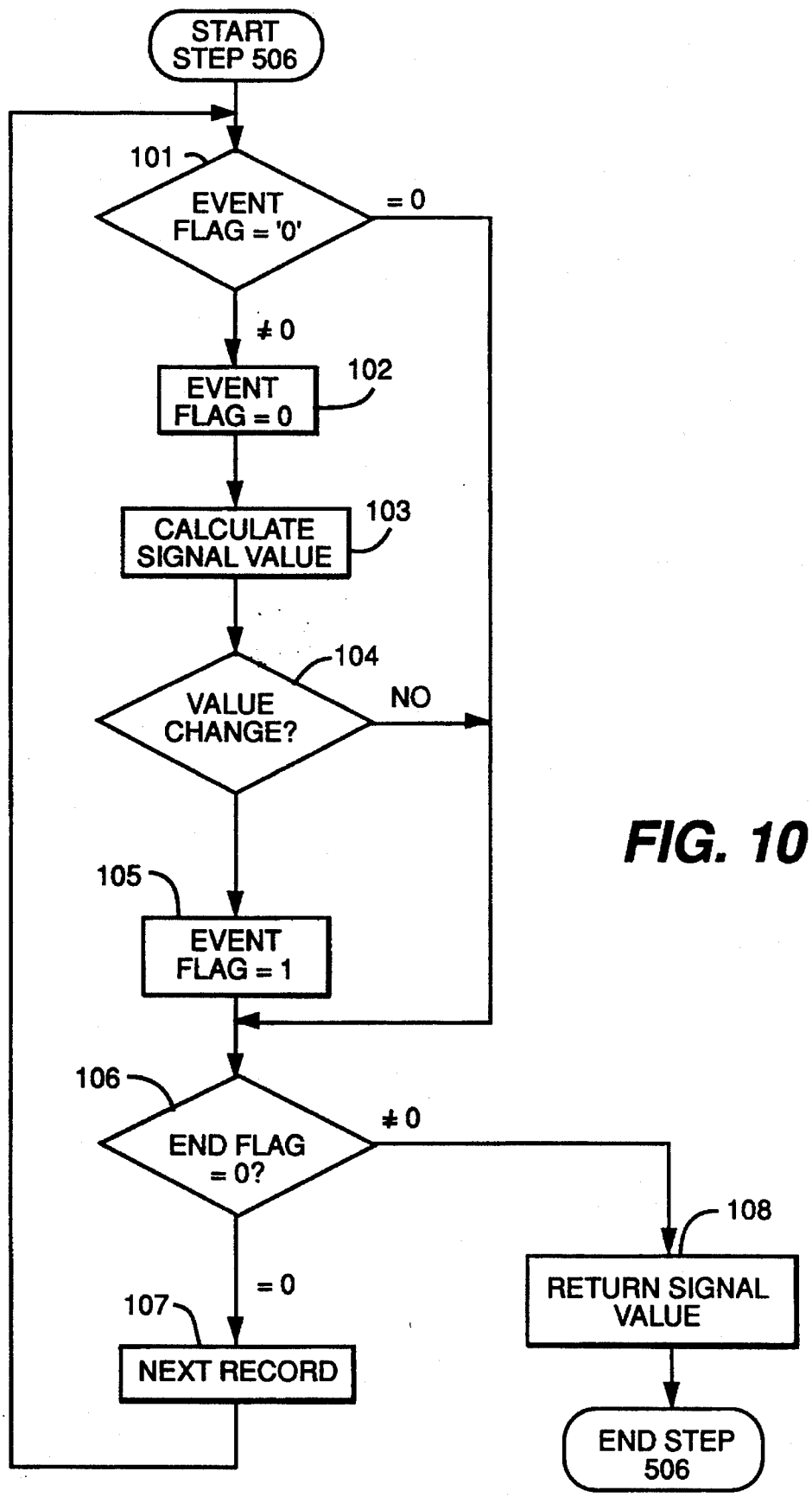
FIG. 10 is a flowchart showing the logic expression evaluating step of the third embodiment.
Figure 11:
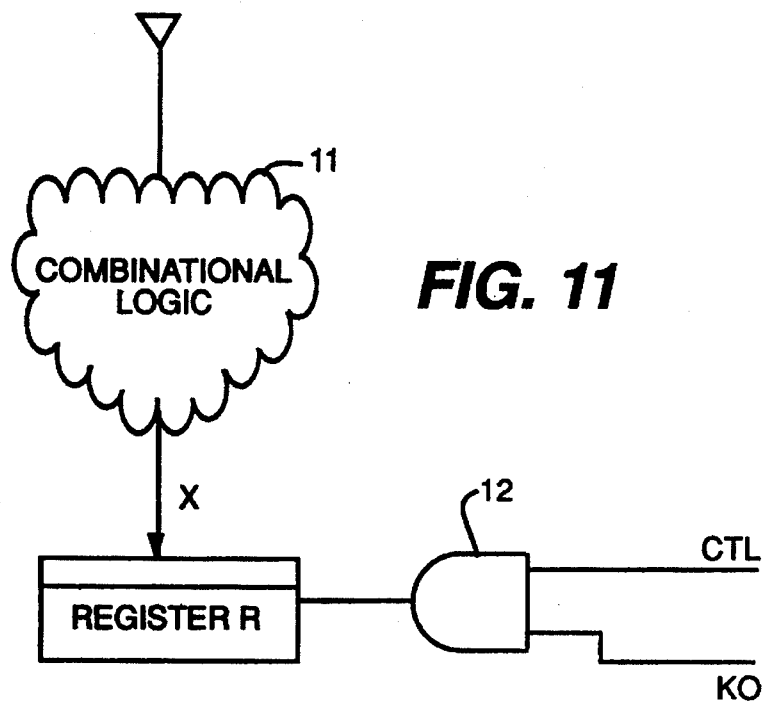
FIG. 11 and FIG. 12 are diagrams for explaining a problem to be solved by the present invention.

Now, the third embodiment of the present invention will be described with reference to FIGS. 9 and 10. The third embodiment is such that each operator is evaluated as to only the operator whose output value changed besides the change of the input value explained in the second embodiment, so that effectively the third embodiment includes the second embodiment. That is, the evaluation of the operator associated with the evaluation of one logic expression is also done.

To begin with, data structures for use in this embodiment will be described with reference to FIG. 9.

An operator table 95 is the extension of the operator table 75 in the second embodiment. Records in the case of developing a certain logic expression are sequenced in the same way as in the preceding embodiments. Each record of the operator table 95 consists of six fields. The first field through the fifth field are respectively the same as the first field through the fifth field of each record of the operator table 75 of the second embodiment shown in FIG. 7(b). The sixth field VV contains the record No. of a record referring to the output value of the pertinent operator, among a series of records which are the developed results of the certain logic expression.

Data organizations other than those of the operator table 95 for use in this embodiment are the same as explained in the second embodiment. The data structures in this embodiment have therefore been described. The outline of the process of this embodiment is the same as shown in FIG. 5 in the preceding embodiment.

Since, in the third embodiment, the step of evaluating the logic expression differs from those of the first and second embodiments, such difference will now be described with reference to FIG. 10.

Step 101 refers to the first field (for example, 952-1) of a record (for example, 952) within the operator table 95 being processed. When the content of the first field referred to, namely, the event flag is '0', the step 101 is followed by a step 106 because no input signal value of the corresponding operator changed, and when not, the step 101 is followed by a step 102. At the step 102, the content of the first field 952-1, the event flag, is set at '0'. Step 103 is the same as the step 805 in FIG. 8 in the second embodiment stated before. The calculated result is stored in the third field (for example, 952-3) of the record (for example, 952) being processed. Succeeding step 104 checks if the content of the field 952-3 has changed. When the preceding step 103 decides the change of the content of the field 952-3, the step 104 is followed by a step 105, and when not, the step 104 is followed by the step 106. For the purpose of event propagation within the logic expression, the step 105 refers to the content of the sixth field 952-6 and sets '1' as the content of the first field (for example, 954-1) namely, the event flag, of the record (for example, 954) indicated by the content referred to. The step 106 refers to the second field, the end flag, (for example, 952-2) of the record (for example, 952) being processed. When the content referred to is '0', the step 106 is followed by a step 107, and when not, the step 106 is followed by a step 108. At the step 107, the process is advanced to the next record within the operator table 95. At the step 108, the content of the third field (for example, 955-3) of the record (for example, 955) being processed is fetched and is returned as the evaluated result of the logic expression part of the combinational logic.

The process of evaluating the logic expression in the third embodiment is now complete, as stated above.

Figure 13:
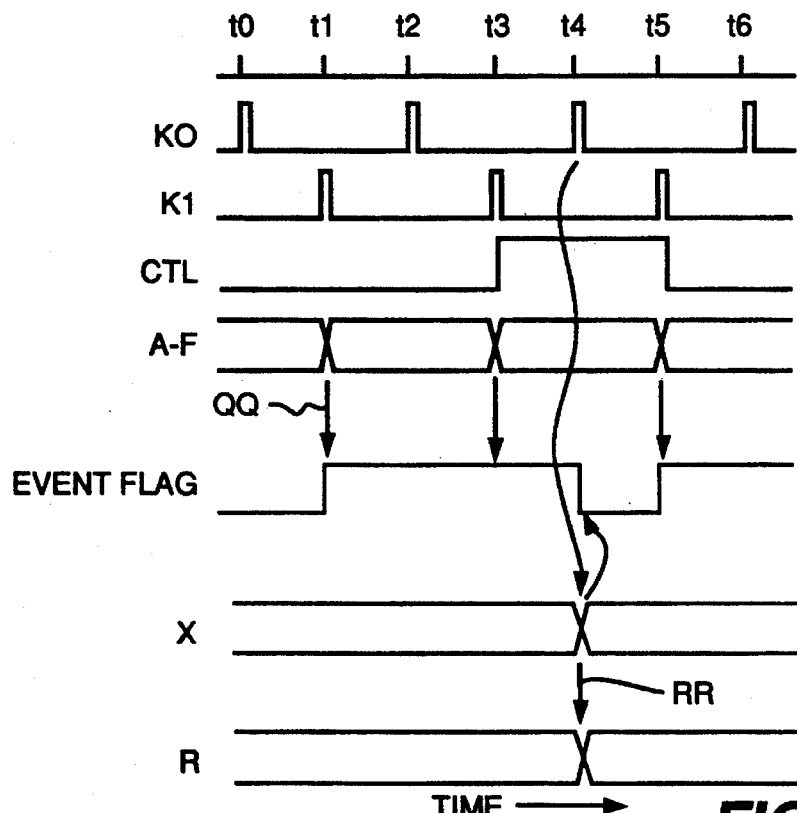
FIG. 13 is a timing chart in the case where the present invention is performed.

FIG. 13 is a timing chart showing the changes of the respective signals in the performance of the present invention.

Figure 12:
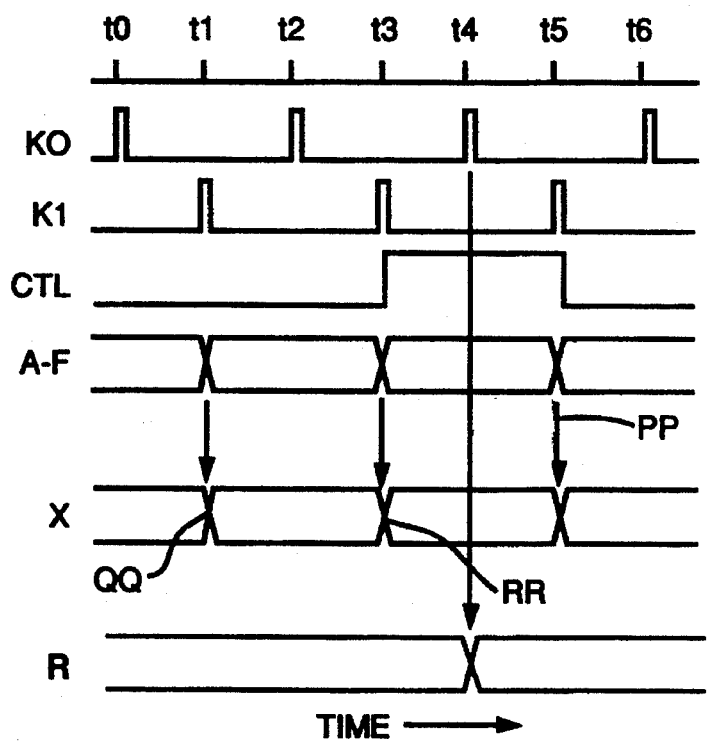

With reference to FIG. 1, the change of one of the input signals A–F (a setting of the event flag 15),and also assertion of both the clock signal (K0), and the control signal CTL sensed in AND gate 12, (a write demand signal for the register R) are sensed in AND gate 16. The combinational logic simulation 11 is executed by activating, thereby to deliver the output signal X that is the placed in register R as enabled by the sensed result of AND gate 12. In consequence, a useless evaluation based on event QQ exemplified in FIG. 12 can be eliminated as shown in FIG. 13, so that only the valid results RR are obtained and processed. Upon obtaining the valid result, the event flag is reset.

According to all the embodiments, the logic expression corresponding to the combinational logic part is evaluated only when there is a demand for changed data transferring to the register R, so that useless evaluations can be suppressed. Moreover, in the third embodiment the evaluation of the logic expression is not done for every operator constituting the logic expression and is done as to only the operator whose input value changed and whose output value is demanded, so that the number of the evaluations of the operators can be curtailed. That is, effectively FIG. 1 duplicated for each of the operators.

According to the present invention, an event having occurred in a certain element for example gate representing an operator or partial circuit of gates representing a combination of operators is not immediately evaluated, but when an element included in another partial circuit or element requires the output value of the pertinent element or partial circuit, the event having occurred before is evaluated, thereby making it possible to inhibit wasteful processes for calculating output values. Thus, the invention can provide a logic simulation of high speed owing to the solution of the problem of the selective trace technique that the calculation of the output values of individual elements constituting a circuit to-be-simulated is caused by an event only and is quite irrelevant to whether or not an element included in another partial circuit refers to the output values calculated anew, so the output value calculation is sometimes useless.

According to the first embodiment, all operators constituting a logic expression are evaluated in the evaluation of the logic expression, so that a one time of reference to an event flag suffices for the logic expression, so that when the event occurrence rate of each operator is comparatively high, the first embodiment can render the speed of a simulation process higher than the other two embodiments. Further, according to the first embodiment, the record length of the operator table is shorter than in the other embodiments, so that a required memory capacity can be rendered smaller than in the other two embodiments. According to the second embodiment, a logic expression is not evaluated for every operator constituting the logic expression and is evaluated as to only the operator whose input value changed or whose preceding operator was evaluated, so that the number of evaluations of the values of the operators can be rendered smaller than in the first embodiments. According to the third embodiment, although the step of setting an event flag on a fan-out side is needed after the calculation of the signal value of each operator, a logic expression is evaluated for every operator constituting the logic expression and as to only the operator whose input value and output value changed. Therefore, the number of evaluations of the values of the operators can be rendered smaller than in the first and second embodiments, and when the event occurrence rate of each operator is low, the third embodiment can render the speed of a simulation process higher than the first and second embodiments.

While three embodiments have been specifically described, these employ the same hardware, the embodiments may be run according to selection by a user so that they effectively constitute a single preferred embodiment with a choice of three different processes, with the most desirable selection predicated upon the event occurrence rate.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A logic simulation system, for simulating a logic circuit which has a plurality of combinational logic circuits and a plurality of registers, comprising:

means for sensing a change in an input value sent to one of said combinational logic circuits;

means for storing an indicator, which was prepared for each combinational logic circuit, when said input value has changed;

means for generating a demand in response to input values received by another combinational logic circuit, and providing said demand to said one of the combinational logic circuits;

means for sensing a demand, and controlling execution of the simulation when said demand has been sensed and said indicator has been stored.

2. The logic simulation system of claim 1, wherein:

said means for generating a demand generates a demand according to a result of said another combinational logic circuit.

3. The logic simulation system of claim 2, wherein:

one of said registers is controlled to store a result of execution of the simulation.

4. The logic simulation system of claim 3, wherein:

said means for storing an indicator is reset by said demand.

5. A logic simulation method for simulating a logic circuit which has a plurality of sets of combinational logic circuits and registers, comprising the following steps:

(a) preparing a plurality of fields corresponding to said plurality of sets of combinational logic circuits for storing an indicator;

(b) applying external input signals to said plurality of sets of combinational logic circuits for executing a simulation;

(c) generating said indicator, when at least one of the external input signals for one of the combinational logic circuits has changed, and storing the indicator to a corresponding field of said plurality of fields;

(d) generating a demand signal at another combinational logic circuit different from said one of the combinational logic circuits and providing said demand signal to said one of the combinational logic circuits, as a result of executing a simulation for said another combinational logic circuit;

(e) executing a simulation for said one of the combinational logic circuits, when said indicator has been stored and when said demand signal has been provided; and (f) storing a result of the simulation executed for said one of the combinational logic circuits to a register corresponding to said one of the combinational logic circuits.

6. The logic simulation method according to claim 5, further comprising the following step:

prior to said step (e) of executing a simulation, setting said register corresponding to said one of the combinational logic circuits for storing said result of the simulation.

7. The logic simulation method according to claim 6, further comprising the following step:

after said step (d) of generating a demand signal, resetting said indicator stored in said corresponding field.

8. A logic simulation method for simulating a logic circuit which has a plurality of sets of combinational logic circuits and registers, comprising the following steps:

(a) at first, preparing a plurality of fields corresponding to said plurality sets of said combinational logic circuits and registers for storing an indicator;

(b) applying values of external input signals to said logic circuit for executing a simulation, after said step of preparing a plurality of fields;

(c) storing said indicator, when at least one input signal value for one of the combinational logic circuits has changed, to a corresponding field;

(d) at another combinational logic circuit, deciding to generate a demand based upon input signal values received by said another combinational logic circuit, and providing said demand to said one of the combinational logic circuits;

(e) deciding if the demand has been provided and if said indicator has been stored, and executing a simulation for said one of the combinational logic circuits, when said demand has been provided and said indicator has been stored;

(f) storing the result of the simulation for said one of the combinational logic circuits to a register corresponding to said one of the combinational logic circuits.

9. The logic simulation method according to claim 8, further comprising the following step:

prior to said step (e) of executing a simulation, setting said register to store said result of the simulation in response to said demand.

10. The logic simulation method according to claim 9, further comprising the following step:

after providing said demand, resetting said indicator stored in said corresponding field.

11. A logic simulation method for simulating a logic circuit which has a plurality of sets of combinational logic circuits and registers, comprising the following steps:

(a) at first, preparing a plurality of fields corresponding to said plurality of sets of combinational logic circuits and registers for storing indicator;

(b) applying values of external input signals to said logic circuit for executing a simulation, after said step of preparing a plurality of fields;

(c) storing an indicator, when at least one input signal value for one of the combinational logic circuits has changed, to said corresponding field;

(d) at another combinational logic circuit, deciding to generate a demand based upon input signal values received by said another combinational logic circuit, and providing said demand to said one of the combinational logic circuits;

(e) deciding if the demand has been provided and if said indicator has been stored;

(f) after said deciding step, controlling conditional execution of a simulation.

12. The logic simulation method according to claim 11, further comprising the following step:

after said step (e) of deciding, when said demand has been provided and said indicator has been stored, performing said step (f) of controlling by executing a simulation for said one of the combinational logic circuits.

13. The logic simulation method according to claim 11, further comprising the following step:

after said step (e) of deciding, when said demand has been provided and said indicator has not been stored, performing said step (f) of controlling by not executing a simulation of said one of the combinational logic circuits.

14. A logic simulation method for simulating a logic circuit which has a plurality of combinational logic circuits, comprising the steps of:

storing an indicator, when an input signal value for one of the combinational logic circuits has changed;

at another combinational logic circuit, providing a demand to said one of the combinational logic circuits as a result of simulating said another combinational logic circuit;

at said one of the combinational logic circuits, sensing a demand; and simulating the logic of said one of the combinational logic circuits to produce a result only when the indicator has been stored since last simulating the logic of said one of the combinational logic circuits and when the demand has been sensed.

* * * * *